United States Patent
Ho et al.

(10) Patent No.: US 7,173,483 B2
(45) Date of Patent: Feb. 6, 2007

(54) LOW-DISTORTION TRI-STATE SWITCHING AMPLIFIER

(75) Inventors: Jung-Dar Ho, Hsinchu County (TW); Feng-Rurng Juang, Hsinchu (TW)

(73) Assignee: Aimtron Technology Corp., Hsinchu (TW)

( * ) Notice: Subject to any disclaimer, the term of this patent is extended or adjusted under 35 U.S.C. 154(b) by 95 days.

(21) Appl. No.: 10/906,747

(22) Filed: Mar. 4, 2005

(65) Prior Publication Data
US 2006/0197589 A1    Sep. 7, 2006

(51) Int. Cl.
*H03F 3/38* (2006.01)
(52) U.S. Cl. ............... 330/10; 330/207 A; 330/251
(58) Field of Classification Search ............ 330/10
See application file for complete search history.

(56) References Cited

U.S. PATENT DOCUMENTS

| 3,585,517 A | 6/1971 | Roger |
| 4,240,036 A * | 12/1980 | Kohler ............ 330/10 |
| 5,077,539 A | 12/1991 | Howatt |
| 5,617,058 A | 4/1997 | Adrian et al. |
| 5,982,231 A * | 11/1999 | Nalbant ............ 330/10 |
| 6,211,728 B1 | 4/2001 | Chen et al. |
| 6,262,632 B1 | 7/2001 | Corsi et al. |
| 6,373,336 B1 | 4/2002 | Anderskouv et al. |
| 6,614,297 B2 | 9/2003 | Score et al. |
| 6,727,752 B2 | 4/2004 | Skinner et al. |

* cited by examiner

*Primary Examiner*—Robert Pascal
*Assistant Examiner*—Alan Wong
(74) *Attorney, Agent, or Firm*—Winston Hsu (57) ABSTRACT

A switching amplifier includes a level shifting circuit for adjusting a voltage level of an original input signal to generate a first input signal and a second input signal. The first input signal is identical to the original input signal except for referring to a first reference level. The second input signal is identical to the original input signal except for referring to a second reference level. In response to the first input signal and an oscillating signal, a first control circuit generates a first width-limited PWM signal for controlling a first half-bridge switching circuit. In response to the second input signal and the oscillating signal, a second control circuit generates a second width-limited PWM signal for controlling a second half-bridge switching circuit.

7 Claims, 11 Drawing Sheets

LOW-DISTORTION TRI-STATE SWITCHING AMPLIFIER

BACKGROUND OF THE INVENTION

1. Field of the Invention

The present invention relates to a switching amplifier and, more particularly, to a tri-state switching amplifier capable of reducing zero-crossing distortion and enhancing efficiency.

2. Description of the Related Art

Conventional switching amplifiers are controlled by a pulse-width-modulation (PWM) signal generated in response to an input signal and an oscillating signal. Transistors of the switching amplifier are turned on or off under the control of the PWM signal, for generating a wave train with discrete pulses of the same amplitude. The discrete pulses are transformed to a continuous waveform through a low-pass filter circuit for accomplishing the magnification of the input signal. The conventional switching amplifier may be classified into a bi-state switching amplifier and a tri-state switching amplifier.

For the bi-state switching amplifier, a positive-polarity state and a negative-polarity state are respectively operated with the same duty of 50% when the input signal is near zero-crossing in amplitude. Based on the balance between the positive-polarity state and the negative-polarity state, an output signal with zero amplitude is obtained, unfortunately, with a drop in efficiency due to unnecessary energy waste.

Figure 1A:
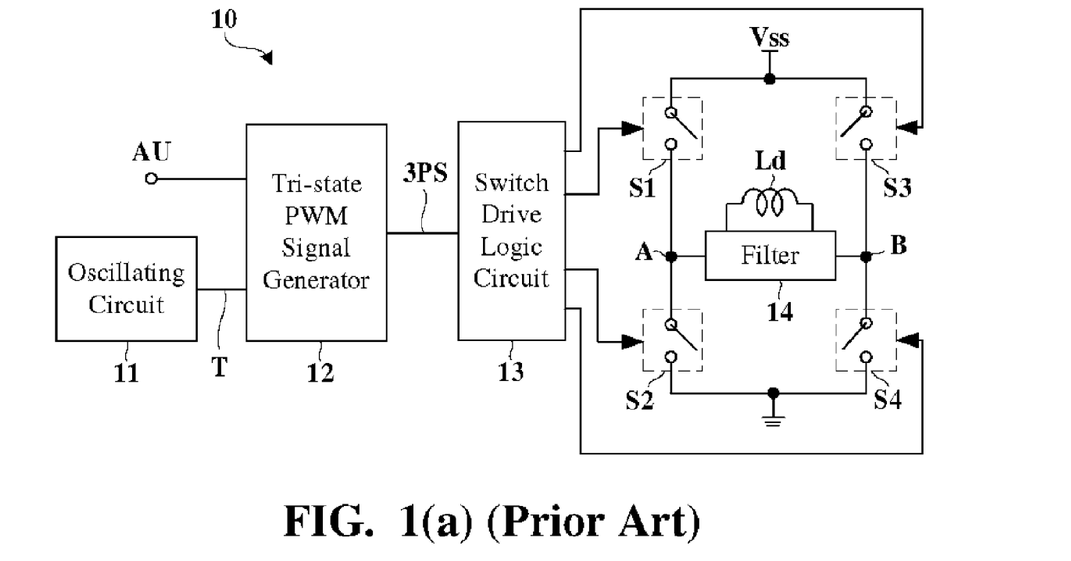
FIG. 1(a) is a circuit block diagram showing a conventional tri-state switching amplifier.
Figure 1B:
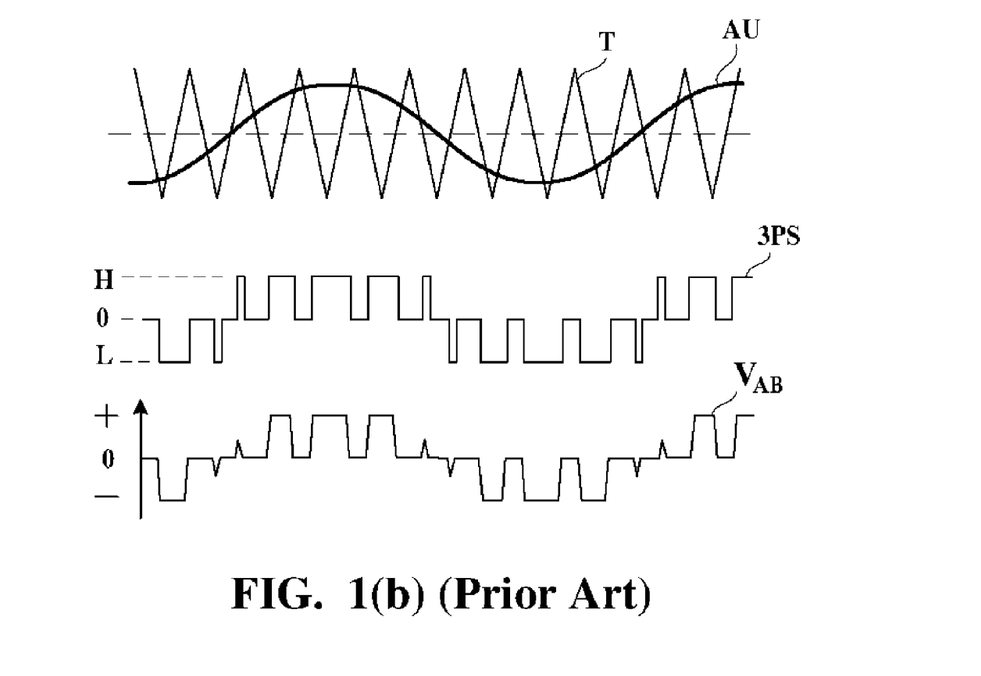
FIG. 1(b) is a waveform timing chart showing an operation of a conventional tri-state switching amplifier.

FIG. 1(a) is a circuit block diagram showing a conventional tri-state switching amplifier 10. FIG. 1(b) is a waveform timing chart showing an operation of the conventional tri-state switching amplifier 10. The tri-state switching amplifier 10 enhances the power of an input signal AU, such as an audio signal, and then supplies it to a load Ld, such as a speaker device. An oscillating circuit 11 applies an oscillating signal T to a tri-state PWM signal generator 12. In response to the input signal AU and the oscillating signal T, the tri-state PWM signal generator 12 generates a tri-state PWM signal 3PS having three states: HIGH, ZERO, and LOW, as shown in FIG. 1(b). When the tri-state PWM signal 3PS is at HIGH, a switch drive logic circuit 13 turns on both of switches S1 and S4, resulting in a potential difference $V_{AB}$ with a positive polarity across the output terminals A and B. When the tri-state PWM signal 3PS is at ZERO, the switch drive logic circuit 13 turns on both of switches S1 and S3 or both of switches S2 and S4, resulting in a potential difference $V_{AB}$ of zero across the output terminals A and B. When the tri-state PWM signal 3PS is at LOW, the switch drive logic circuit 13 turns on both of switches S2 and S3, resulting in a potential difference $V_{AB}$ with a negative polarity across the output terminals A and B. Through a low-pass filter circuit 14, the potential difference $V_{AB}$ is transformed to a continuous waveform output signal for being supplied to the load Ld.

The tri-state switching amplifier 10 is operated in the positive (or negative) polarity state only in a situation that a voltage with the positive (or negative) polarity is required to be supplied from the output terminals A and B. Consequently, the tri-state switching amplifier 10 is operated in the positive (or negative) polarity state with a tiny duty when the input signal AU is near zero-crossing. Although the efficiency is enhanced, the tri-state switching amplifier 10 is subjected to another drawback that the output potential difference $V_{AB}$ is distorted to become a triangular pulse instead of an ideal rectangular pulse when the duty of the positive (or negative) polarity state is reduced until the output voltage $V_{AB}$ fails to completely rise to the full amplitude during a switching period. Furthermore, the rising time and the falling time of the potential difference $V_{AB}$ depend on the characteristics of the switches S1 to S4 and therefore change along with the operating temperature and processing parameters. As a result, the potential difference $V_{AB}$ is difficult to be made free of the zero-crossing distortion.

SUMMARY OF THE INVENTION

In view of the above-mentioned problems, an object of the present invention is to provide a tri-state switching amplifier capable of enhancing the efficiency and reducing the zero-crossing distortion.

According to one aspect of the present invention, a switching amplifier is provided with an oscillating circuit, a level shifting circuit, a first control circuit, and a second control circuit. The oscillating circuit generates an oscillating signal. The level shifting circuit adjusts a voltage level of an original input signal to generate a first input signal and a second input signal. The first input signal is identical to the original input signal except for referring to a first reference level. The second input signal is identical to the original signal except for referring to a second reference level. The first reference level is between a mean level and a valley of the oscillating signal. The second reference level is between a peak and the mean level of the oscillating signal. In response to the first input signal and the oscillating signal, the first control circuit generates a first width-limited PWM signal for controlling a first half-bridge switching circuit. In response to the second input signal and the oscillating signal, the second control circuit generates a second width-limited PWM signal for controlling a second half-bridge switching circuit.

According to another aspect of the present invention, a switching amplifier is provided with an oscillating circuit, a first control circuit, and a second control circuit. The oscillating circuit generates a first oscillating signal and a second oscillating signal such that a reference level of an input signal is between a mean level and a valley of the first oscillating signal and between a peak and a mean level of the second oscillating signal. The first and the second oscillating signals are identical in phase and in amplitude with respect to each other. In response to the input signal and the first oscillating signal, the first control circuit generates a first width-limited PWM signal for controlling a first half-bridge switching circuit. In response to the input signal and the second oscillating signal, the second control circuit generates a second width-limited PWM signal for controlling a second half-bridge switching circuit.

According to still another aspect of the present invention, a switching amplifier is provided with an oscillating circuit, an inverting circuit, a first control circuit, and a second control circuit. The oscillating circuit generates an oscillating signal and an inverted oscillating signal. A mean level of the oscillating signal is substantially equal to a mean level of the inverted oscillating signal. The first and the second oscillating signals are identical in amplitude with respect to each other. The inverting circuit inverts an input signal through using a reference level of the input signal as a symmetric axis so as to generate an inverted input signal. The reference level is between a peak and a valley of the oscillating signal. In response to the input signal and the oscillating signal, the first control circuit generates a first width-limited PWM signal for controlling a first half-bridge switching circuit. In response to the inverted input signal and the inverted oscillating signal, the second control circuit generates a second width-limited PWM signal for controlling a second half-bridge switching circuit.

Preferably, each of the first and the second control circuits may include a PWM comparator and a width limiting circuit.

Preferably, each of the first and the second control circuits may be implemented by a tri-input PWM comparator.

Each pulse in the first width-limited PWM signal has a width larger than or equal to a predetermined first width for allowing a potential at a first output terminal of the first half-bridge switching circuit to completely rise during each switching period. Each pulse in the second width-limited PWM signal has a width larger than or equal to a predetermined second width for allowing a potential at a second output terminal of the second half-bridge switching circuit to completely rise during each switching period.

BRIEF DESCRIPTION OF THE DRAWINGS

The above-mentioned and other objects, features, and advantages of the present invention will become apparent with reference to the following descriptions and accompanying drawings, wherein.

DETAILED DESCRIPTION OF THE PREFERRED EMBODIMENTS

The preferred embodiments according to the present invention will be described in detail with reference to the drawings.

Figure 2:
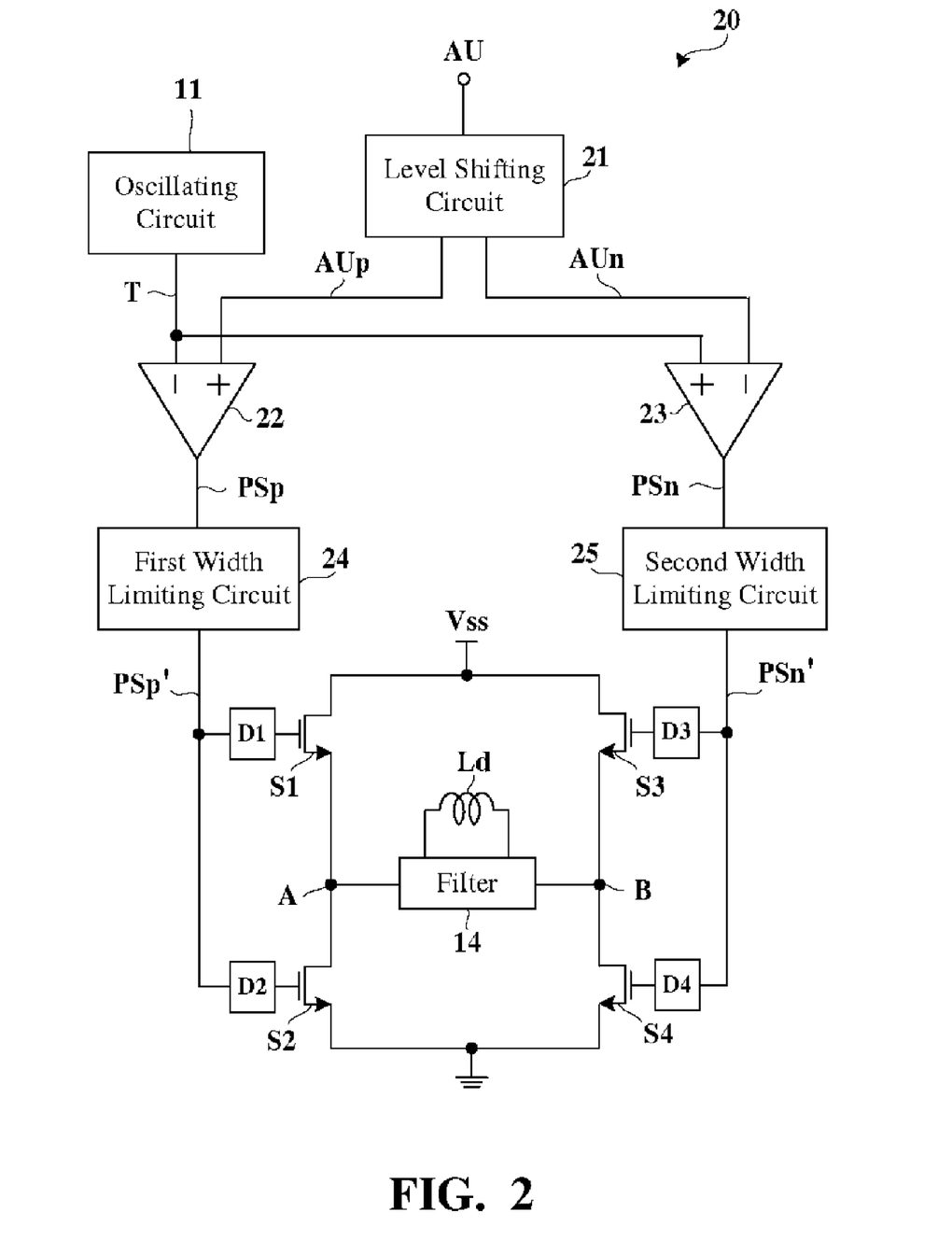
FIG. 2 is a circuit block diagram showing a tri-state switching amplifier according to a first embodiment of the present invention.

FIG. 2 is a circuit block diagram showing a tri-state switching amplifier 20 according to a first embodiment of the present invention. In FIG. 2, for simplicity, like reference numerals have been used to identify like components illustrated in FIG. 1 and previously described, with additional detail being shown in the timing and control portion of the circuit relevant to the first embodiment. The tri-state switching amplifier 20 includes a level shifting circuit 21 for providing an original input signal AU with a first reference level $V_{refp}$ and a second reference level $V_{refn}$, in order to generate a first input signal $AU_p$ and a second input signal $AU_n$.

Figure 3A:
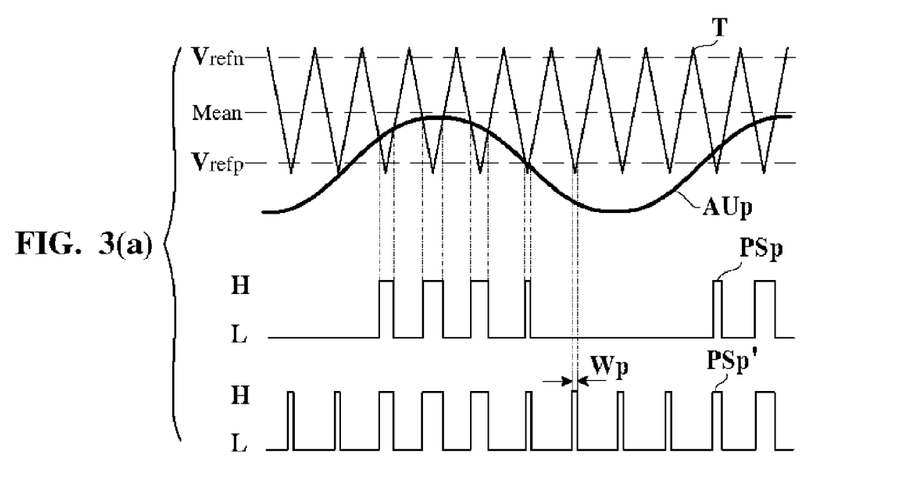
FIGS. 3(a) to 3(c) are waveform timing charts showing an operation of a tri-state switching amplifier according to a first embodiment of the present invention.
Figure 3B:
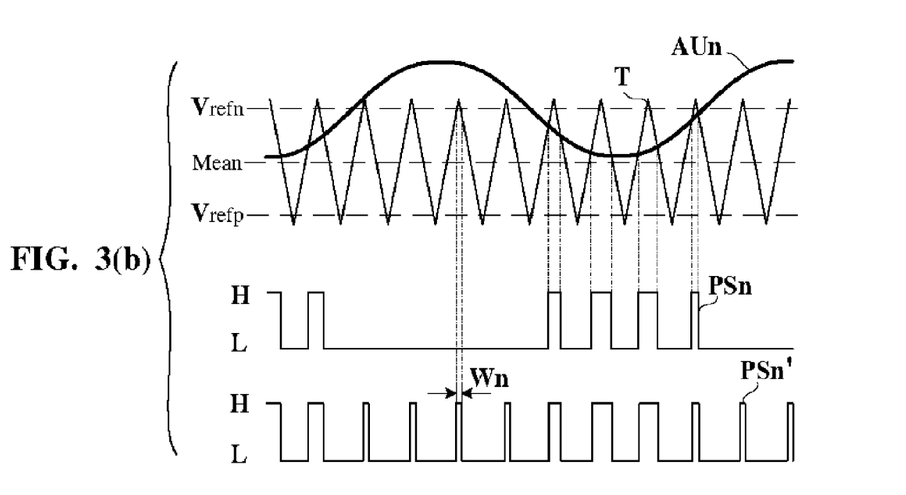

As shown in FIG. 3(a), the first input signal $AU_p$ is generated from the level shifting circuit 21 by adjusting the voltage level of the original input signal AU to refer to the first reference level $V_{refp}$. The first reference level $V_{refp}$ is set to be slightly higher than the valley of the oscillating signal T. In an embodiment, a difference between the first reference level $V_{refp}$ and the valley of the oscillating signal T is set to be substantially equal to 5% of a difference between the peak and the valley of the oscillating signal T. As shown in FIG. 3(b), the second input signal $AU_n$ is generated from the level shifting circuit 21 by adjusting the voltage level of the original input signal AU to refer to the second reference level $V_{refn}$. The second reference level $V_{refn}$ is set to be slightly lower than the peak of the oscillating signal T. In an embodiment, a difference between the peak of the oscillating signal T and the second reference level $V_{refn}$ is set to be substantially equal to 5% of a difference between the peak and the valley of the oscillating signal T. Therefore, the first and the second input signals $AU_p$ and $AU_n$ are identical to the original input signal AU except for referring to the first and the second reference levels $V_{refp}$ and $V_{refn}$, respectively.

A first PWM comparator 22 has an inverting input terminal for receiving the oscillating signal T, and a non-inverting input terminal for receiving the first input signal $AU_p$. Based on the comparison of the oscillating signal T and the first input signal $AU_p$, the first PWM comparator 22 generates a first PWM signal $PS_p$ with binary states H and L, as shown in FIG. 3(a). The positive polarity component of the first input signal $AU_p$ corresponds to the positive polarity component of the original input signal AU and has a dynamic range between the peak and the valley of the oscillating signal T. Therefore, the first PWM signal $PS_p$ has width-modulated pulses representative of the positive polarity component of the original input signal AU. It should be noted that the pulse width of the first PWM signal $PS_p$ is restricted to be larger than or equal to a minimum width $W_p$ because of the slight difference between the first reference level $V_{refp}$ and the valley of the oscillating signal T. On the other hand, the negative polarity component of the first input signal $AU_p$ corresponds to the negative polarity component of the original input signal AU and has a dynamic range under the valley of the oscillating signal T (if, for simplicity, the slight difference between the first reference level $V_{refp}$ and the valley of the oscillating signal T is not considered). Therefore, the negative polarity component of the first input signal $AU_p$ is not transformed to any pulses. When it comes to that the negative polarity component of the first input signal $AU_p$ is between the first reference level $V_{refp}$ and the valley of the oscillating signal T, a pulse narrower than the minimum width $W_p$ is generated in the first PWM signal $PS_p$. In order to prevent such a pulse narrower than the minimum width $W_p$, a first width limiting circuit 24 is provided to transform the first PWM signal $PS_p$ into a first width-limited PWM signal $PS_p'$. As shown in FIG. 3(a), the first width-limited PWM signal $PS_p'$ has a train of pulses with a constant, minimum width $W_p$, each of the pulses generated correspondingly to the valley of the oscillating signal T.

A second PWM comparator 23 has an inverting input terminal for receiving the second input signal $AU_n$, and a non-inverting input terminal for receiving the oscillating signal T. Based on the comparison of the second input signal $AU_n$ and the oscillating signal T, the second PWM comparator 23 generates a second PWM signal $PS_n$ with binary states H and L, as shown in FIG. 3(b). The negative polarity component of the second input signal $AU_n$ corresponds to the negative polarity component of the original input signal AU and has a dynamic range between the peak and the valley of the oscillating signal T. Therefore, the second PWM signal $PS_n$ has width-modulated pulses representative of the negative polarity component of the original input signal AU. It should be noted that the pulse width of the second PWM signal $PS_n$ is restricted to be larger than or equal to a minimum width $W_n$ because of the slight difference between the peak of the oscillating signal T and the second reference level $V_{refn}$. On the other hand, the positive polarity component of the second input signal $AU_n$ corresponds to the positive polarity component of the original input signal AU and has a dynamic range over the peak of the oscillating signal T (if, for simplicity, the slight difference between the peak of the oscillating signal T and the second reference level $V_{refn}$ is not considered). Therefore, the positive polarity component of the second input signal $AU_n$ is not transformed to any pulses. When it comes to that the positive polarity component of the second input signal $AU_n$ is between the peak of the oscillating signal T and the second reference level $V_{refn}$, a pulse narrower than the minimum width $W_n$ is generated in the second PWM signal $PS_n$. In order to prevent such a pulse narrower than the minimum width $W_n$, a second width limiting circuit 25 is provided to transform the second PWM signal $PS_n$ into a second width-limited PWM signal $PS_n'$. As shown in FIG. 3(b), the second width-limited PWM signal $PS_n'$ has a train of pulses with a constant, minimum width $W_n$, each of the pulses generated correspondingly to the peak of the oscillating signal T.

The H-bridge circuit of switches S1 to S4 may be considered as a combination of a first half-bridge circuit constructed by the switches S1 and S2 and a second half-bridge circuit constructed by the switches S3 and S4. The first and the second half-bridge circuits are independently controlled by the first and the second width-limited PWM signal $PS_p'$ and $PS_n'$. Through pre-driving circuits D1 and D2, the first width-limited PWM signal $PS_p'$ applies the pulses to turn on the switch S1 and turn off the switch S2, resulting in a coupling between the output terminal A and the supply voltage source $V_{ss}$. When the first width-limited PWM signal $PS_p'$ is at the low level state L, the switch S1 is turned off and the switch S2 is turned on such that the output terminal A is coupled to the ground potential. Through pre-driving circuits D3 and D4, the second width-limited PWM signal $PS_n'$ applies the pulses to turn on the switch S3 and turn off the switch S4, resulting in a coupling between the output terminal B and the supply voltage source $V_{ss}$. When the second width-limited PWM signal $PS_n'$ is at the low level state L, the switch S3 is turned off and the switch S4 is turned on such that the output terminal B is coupled to the ground potential.

Referring to FIGS. 3(a) and 3(b), the pulses of the first width-limited PWM signal $PS_p'$ are non-overlapping with respect to the pulses of the second width-limited PWM signal $PS_n'$. In response to the pulse of the first width-limited PWM signal $PS_p'$ and the low level L of the second width-limited PWM signal $PS_n'$, the tri-state switching amplifier 20 is operated in the positive polarity state, i.e., the output terminal A is coupled to the supply voltage source $V_{ss}$ and the output terminal B is coupled to the ground potential, thereby supplying a potential difference $V_{AB}$ with a positive polarity. In response to the low level L of the first width-limited PWM signal $PS_p'$ and the pulse of the second width-limited PWM signal $PS_n'$, the tri-state switching amplifier 20 is operated in the negative polarity state, i.e., the output terminal A is coupled to the ground potential and the output terminal B is coupled to the supply voltage source $V_{ss}$, thereby supplying a potential difference $V_{AB}$ with a negative polarity. In response to the low level L of the first width-limited PWM signal $PS_p'$ and the low level L of the second width-limited PWM signal $PS_n'$, the tri-state switching amplifier 20 is operated in the zero differential state, i.e., both of the output terminals A and B are coupled to the ground potential such that the potential difference $V_{AB}$ becomes zero.

Figure 3C:
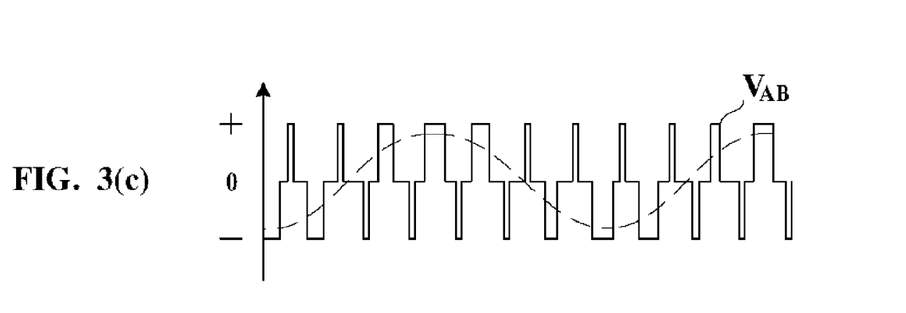

FIG. 3(c) is a waveform timing chart showing the potential difference $V_{AB}$ supplied from the tri-state switching amplifier 20 under the control of the first and the second width-limited PWM signals $PS_p'$ and $PS_n'$ of FIGS. 3(a) and 3(b). As clearly seen from FIG. 3(c), the potential difference $V_{AB}$ is allowed to completely rise during each of the switching periods due to the limitation of the minimum widths $W_p$ and $W_n$, thereby ensuring that the potential difference $V_{AB}$ is rectangular in shape without zero-crossing distortion. Furthermore, the minimum widths $W_p$ and $W_n$ are set constant for avoiding the influence on the rising time caused by the fluctuations of the operating temperature and the processing parameters. Before applied to the load Ld, the potential difference $V_{AB}$ across the output terminals A and B is transformed through the filter circuit 14 into a continuous waveform as indicated by a dashed line of the FIG. 3(c), thereby achieving the magnification of the original input signal AU.

Figure 4A:
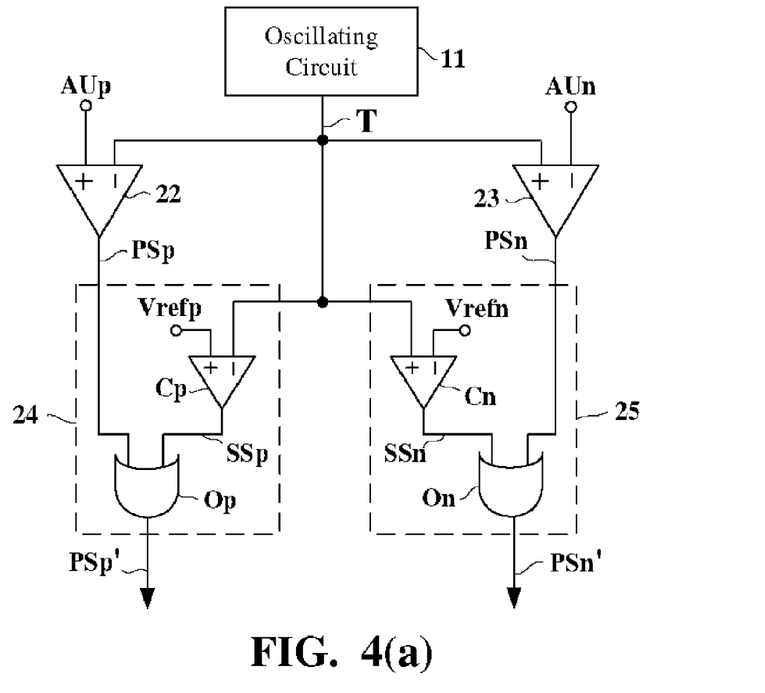
FIG. 4(a) is a detailed circuit diagram showing a first width limiting circuit and a second width limiting circuit.
Figure 4B:
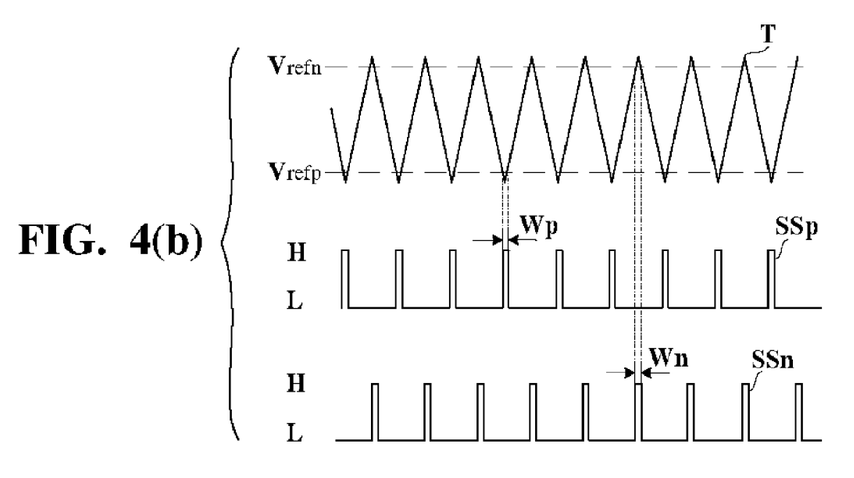
FIG. 4(b) is a waveform timing chart showing an operation of a first width limiting circuit and a second width limiting circuit.

FIG. 4(a) is a detailed circuit diagram showing the first width limiting circuit 24 and the second width limiting circuit 25. FIG. 4(b) is a waveform timing chart showing an operation of the first width limiting circuit 24 and the second width limiting circuit 25. The first width limiting circuit 24 includes a comparator $C_p$ and an OR gate $O_p$. The comparator $C_p$ has an inverting input terminal for receiving the oscillating signal T, and a non-inverting input terminal for receiving the first reference level $V_{refp}$. Consequently, the comparator $C_p$ generates a first width signal $SS_p$ with pulses of the minimum width $W_p$, each of the pulses generated correspondingly to the valley of the oscillating signal T. Through the OR gate $O_p$, the first PWM signal $PS_p$ is combined with the first width signal $SS_p$ and transformed into the first width-limited PWM signal $PS_p'$. Similarly, the second width limiting circuit 25 includes a comparator $C_n$ and an OR gate $O_n$. The comparator $C_n$ has an inverting input terminal for receiving the second reference level $V_{refn}$, and a non-inverting input terminal for receiving the oscillating signal T. Consequently, the comparator $C_n$ generates a second width signal $SS_n$ with pulses of the minimum width $W_n$, each of the pulses generated correspondingly to the peak of the oscillating signal T. Through the OR gate $O_n$, the second PWM signal $PS_n$ is combined with the second width signal $SS_n$ and transformed into the second width-limited PWM signal $PS_n'$.

Figure 5:
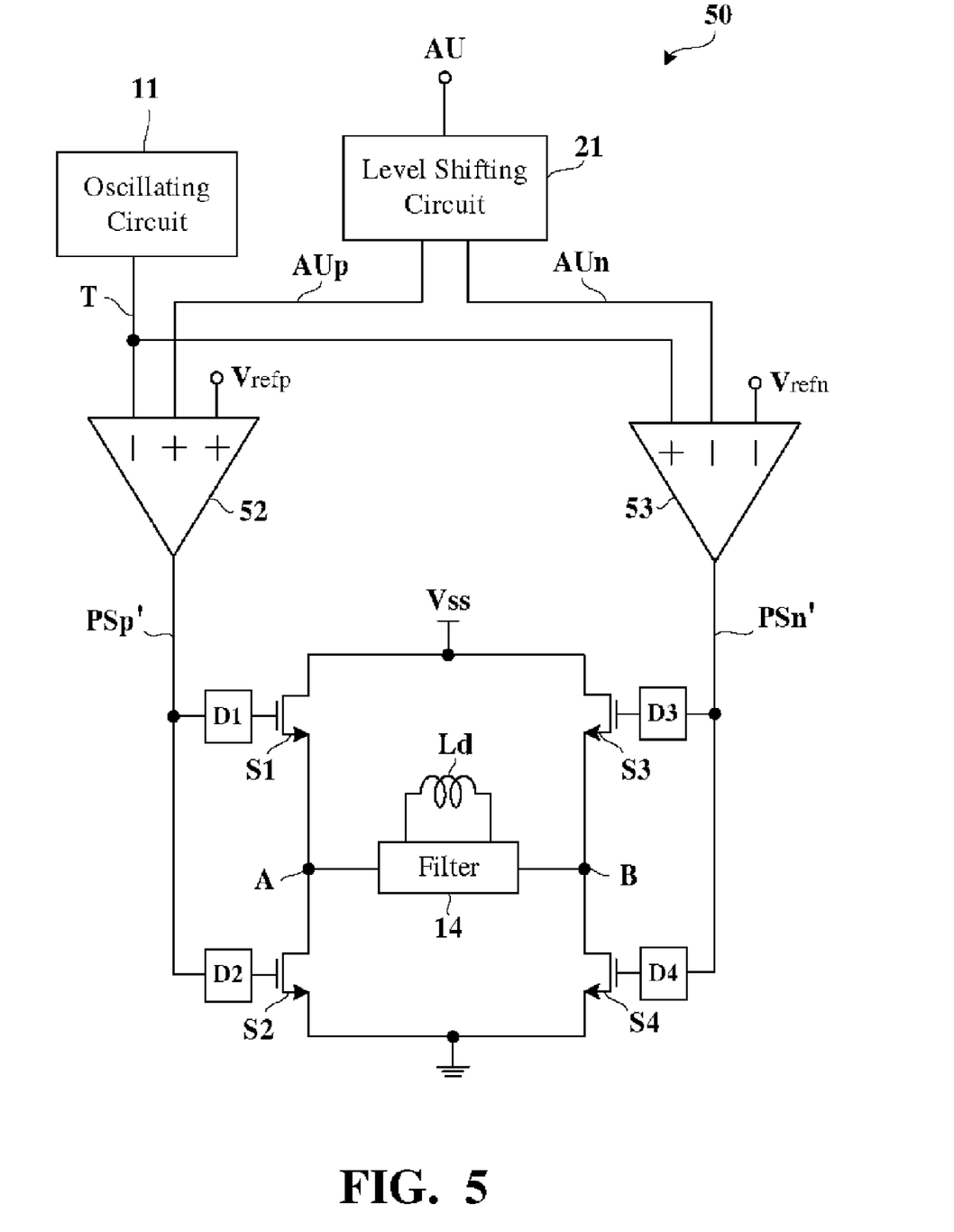
FIG. 5 is a circuit block diagram showing a tri-state switching amplifier according to a second embodiment of the present invention.

FIG. 5 is a circuit block diagram showing a tri-state switching amplifier 50 according to a second embodiment of the present invention. In FIG. 5, for simplicity, like reference numerals have been used to identify like components illustrated in FIG. 2 and previously described, with additional detail being shown in the timing and control portion of the circuit relevant to the second embodiment. The second embodiment is different from the first embodiment in that the tri-state switching amplifier 50 according to the second embodiment replaces the first PWM comparator 22 and the first width limiting circuit 24 of FIG. 2 with a first tri-input PWM comparator 52 and replaces the second PWM comparator 23 and the second width limiting circuit 25 of FIG. 2 with a second tri-input PWM comparator 53. More specifically, the first tri-input PWM comparator 52 has an inverting input terminal for receiving the oscillating signal T, and two non-inverting input terminals for respectively receiving the first input signal $AU_p$ and the first reference level $V_{refp}$. Once the oscillating signal T becomes smaller than either of the first input signal $AU_p$ and the first reference level $V_{refp}$, the first tri-input PWM comparator 52 generates the pulse. Therefore, the first tri-input PWM comparator 52 effectively generates the first width-limited PWM signal $PS_p'$ with one pulse each cycle larger than or equal to the minimum width $W_p$. On the other hand, the second tri-input PWM comparator 53 has two inverting input terminals for respectively receiving the second input signal $AU_n$ and the second reference level $V_{refn}$, and a non-inverting input terminal for receiving the oscillating signal T. Once the oscillating signal T becomes larger than either of the second input signal $AU_n$ and the second reference level $V_{refn}$, the second tri-input PWM comparator 53 generates the pulse. Therefore, the second tri-input PWM comparator 53 effectively generates the second width-limited PWM signal $PS_n'$ with one pulse each cycle larger than or equal to the minimum width $W_n$. Each of the first and the second tri-input PWM comparators 52 and 53 may be implemented by a conventional comparator with three input terminals, which is well known by one skilled in the art, and the detailed description thereof is omitted herein.

Figure 6:
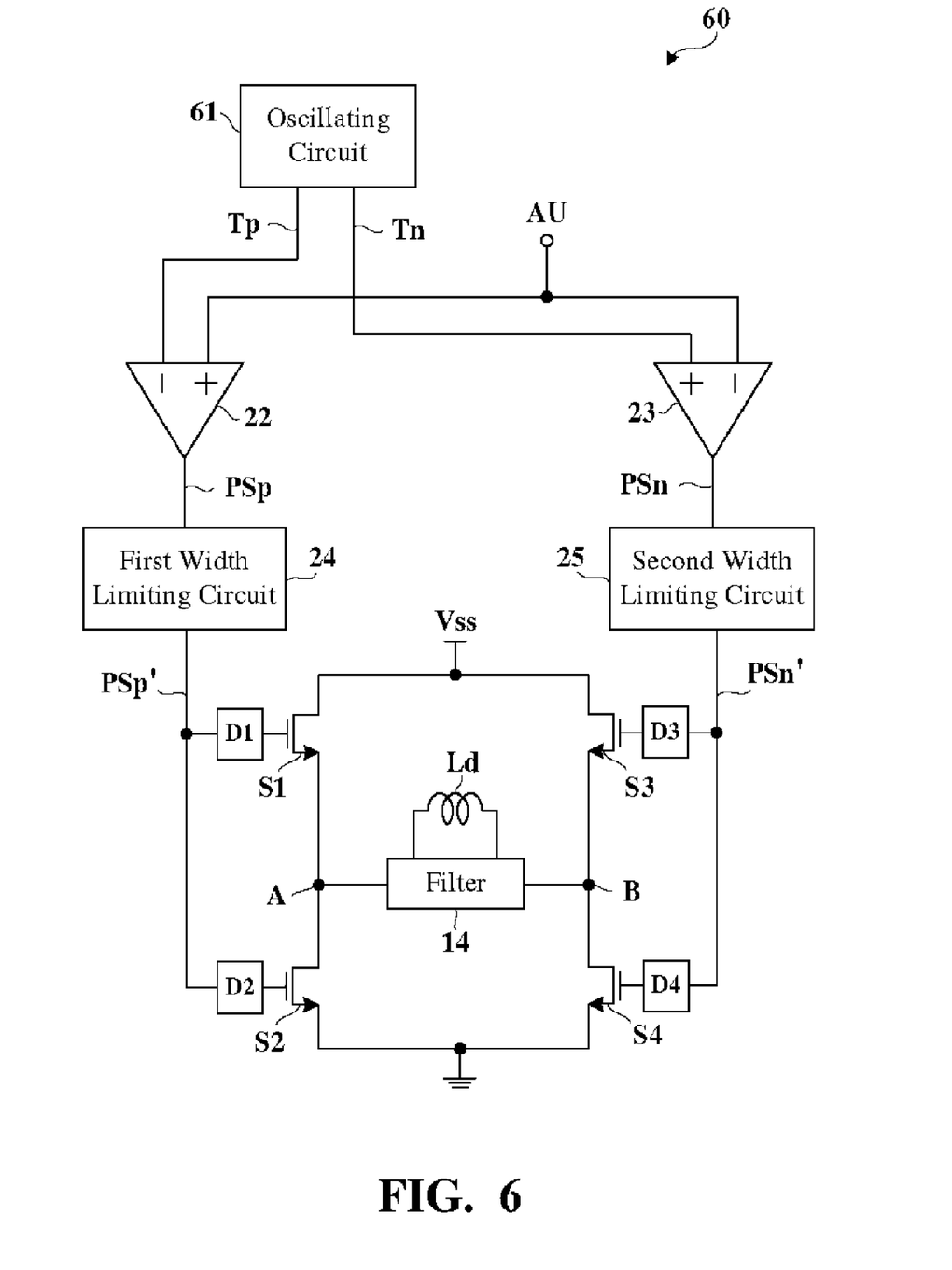
FIG. 6 is a circuit block diagram showing a tri-state switching amplifier according to a third embodiment of the present invention.

FIG. 6 is a circuit block diagram showing a tri-state switching amplifier 60 according to a third embodiment of the present invention. In FIG. 6, for simplicity, like reference numerals have been used to identify like components illustrated in FIG. 2 and previously described, with additional detail being shown in the timing and control portion of the circuit relevant to the third embodiment. The third embodiment is different from the first embodiment in that the tri-state switching amplifier 60 according to the third embodiment replaces the oscillating circuit 11 of FIG. 2 with an oscillating circuit 61 and deletes the use of the level shifting circuit 21 of FIG. 2.

Figure 7:
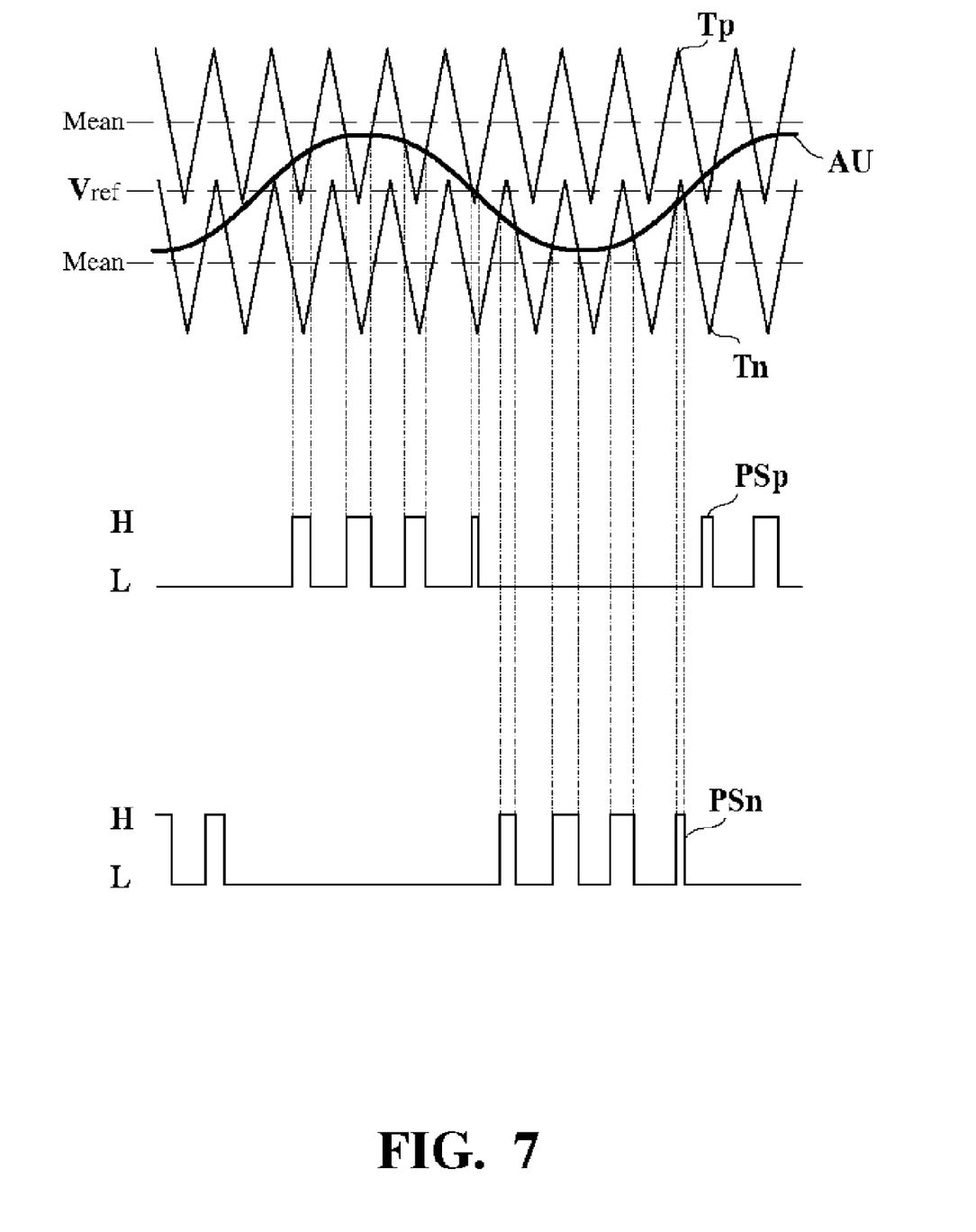
FIG. 7 is a waveform timing chart showing an operation of a tri-state switching amplifier according to a third embodiment of the present invention.

FIG. 7 is a waveform timing chart showing an operation of the tri-state switching amplifier 60 according to the third embodiment of the present invention. The oscillating circuit 61 generates a first oscillating signal $T_p$ and a second oscillating signal $T_n$ having the same phase and amplitude with respect to each other. Additionally, a mean level of the first oscillating signal $T_p$ is in coincidence with a mean level of the second oscillating signal $T_n$. More specifically, the first oscillating signal $T_p$ is provided in such a manner that a reference level $V_{ref}$ of the input signal AU is located between the mean level and the valley of the first oscillating signal $T_p$. The second oscillating signal $T_n$ is provided in such a manner that the reference level $V_{ref}$ of the input signal AU is located between the peak and the mean level of the second oscillating signal $T_n$.

In one embodiment, the difference between the reference level $V_{ref}$ and the valley of the first oscillating signal $T_p$ is substantially equal to 5% of the difference between the peak and the valley of the first oscillating signal $T_p$. The difference between the peak of the second oscillating signal $T_n$ and the reference level $V_{ref}$ is substantially equal to 5% of the difference between the peak and the valley of the second oscillating signal $T_n$.

Based on the comparison of the first oscillating signal $T_p$ and the input signal AU, the first PWM comparator 22 generates a first PWM signal $PS_p$ with binary states H and L. Based on the comparison of the second oscillating signal $T_n$ and the input signal AU, the second PWM comparator 22 generates a second PWM signal $PS_n$ with binary states H and L.

Figure 8:
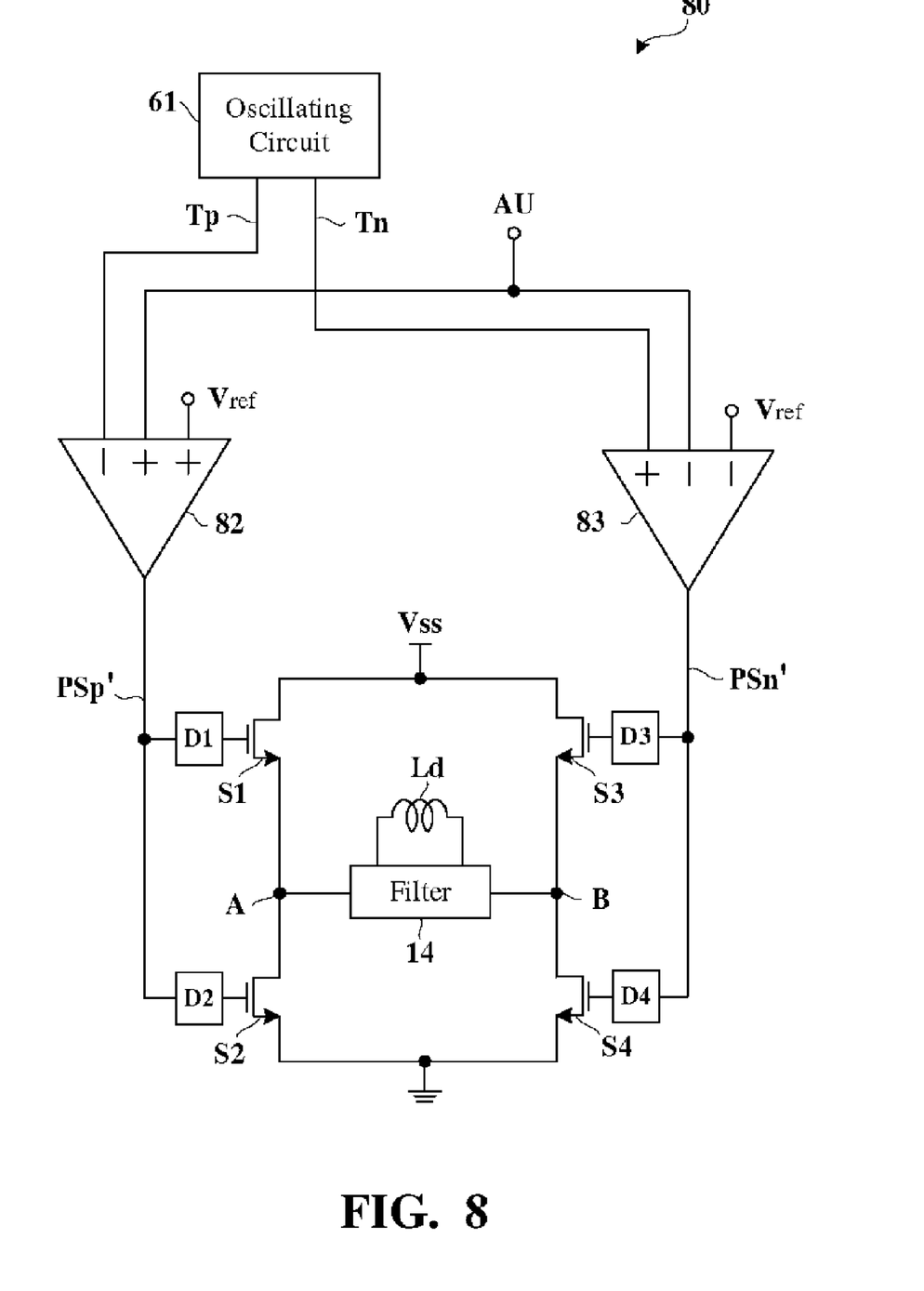
FIG. 8 is a circuit block diagram showing a tri-state switching amplifier according to a fourth embodiment of the present invention.

FIG. 8 is a circuit block diagram showing a tri-state switching amplifier 80 according to a fourth embodiment of the present invention. In FIG. 8, for simplicity, like reference numerals have been used to identify like components illustrated in FIG. 6 and previously described, with additional detail being shown in the timing and control portion of the circuit relevant to the fourth embodiment. The fourth embodiment is different from the third embodiment in that the tri-state switching amplifier 80 according to the fourth embodiment replaces the first PWM comparator 22 and the first width limiting circuit 24 of FIG. 6 with a first tri-input PWM comparator 82 and replaces the second PWM comparator 23 and the second width limiting circuit 25 of FIG. 6 with a second tri-input PWM comparator 83. More specifically, the first tri-input PWM comparator 82 has an inverting input terminal for receiving the first oscillating signal $T_p$, and two non-inverting input terminals for respectively receiving the input signal AU and the reference level $V_{ref}$. Once the first oscillating signal $T_p$ becomes smaller than either of the input signal AU and the reference level $V_{ref}$, the first tri-input PWM comparator 82 generates the pulse. On the other hand, the second tri-input PWM comparator 83 has a non-inverting input terminal for receiving the second oscillating signal $T_n$, and two inverting input terminals for respectively receiving the input signal AU and the reference level $V_{ref}$. Once the second oscillating signal $T_n$ becomes larger than either of the input signal AU and the reference level $V_{ref}$, the second tri-input PWM comparator 83 generates the pulse.

Figure 9:
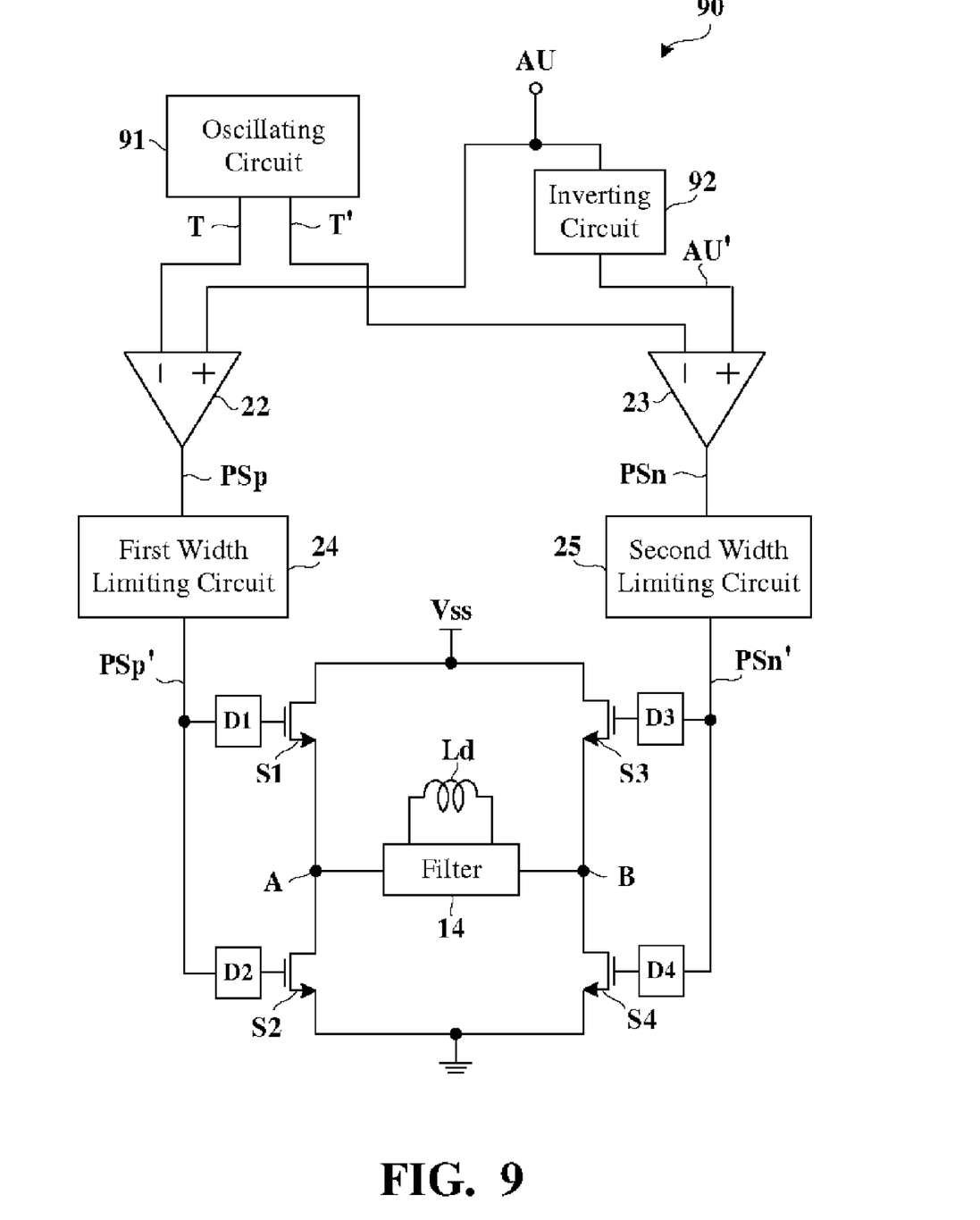
FIG. 9 is a circuit block diagram showing a tri-state switching amplifier according to a fifth embodiment of the present invention.

FIG. 9 is a circuit block diagram showing a tri-state switching amplifier 90 according to a fifth embodiment of the present invention. In FIG. 9, for simplicity, like reference numerals have been used to identify like components illustrated in FIG. 2 and previously described, with additional detail being shown in the timing and control portion of the circuit relevant to the fifth embodiment. The fifth embodiment is different from the first embodiment in that the tri-state switching amplifier 90 according to the fifth embodiment replaces the oscillating circuit 11 of FIG. 2 with an oscillating circuit 91 and replaces the level shifting circuit 21 of FIG. 2 with an inverting circuit 92.

Figure 10:
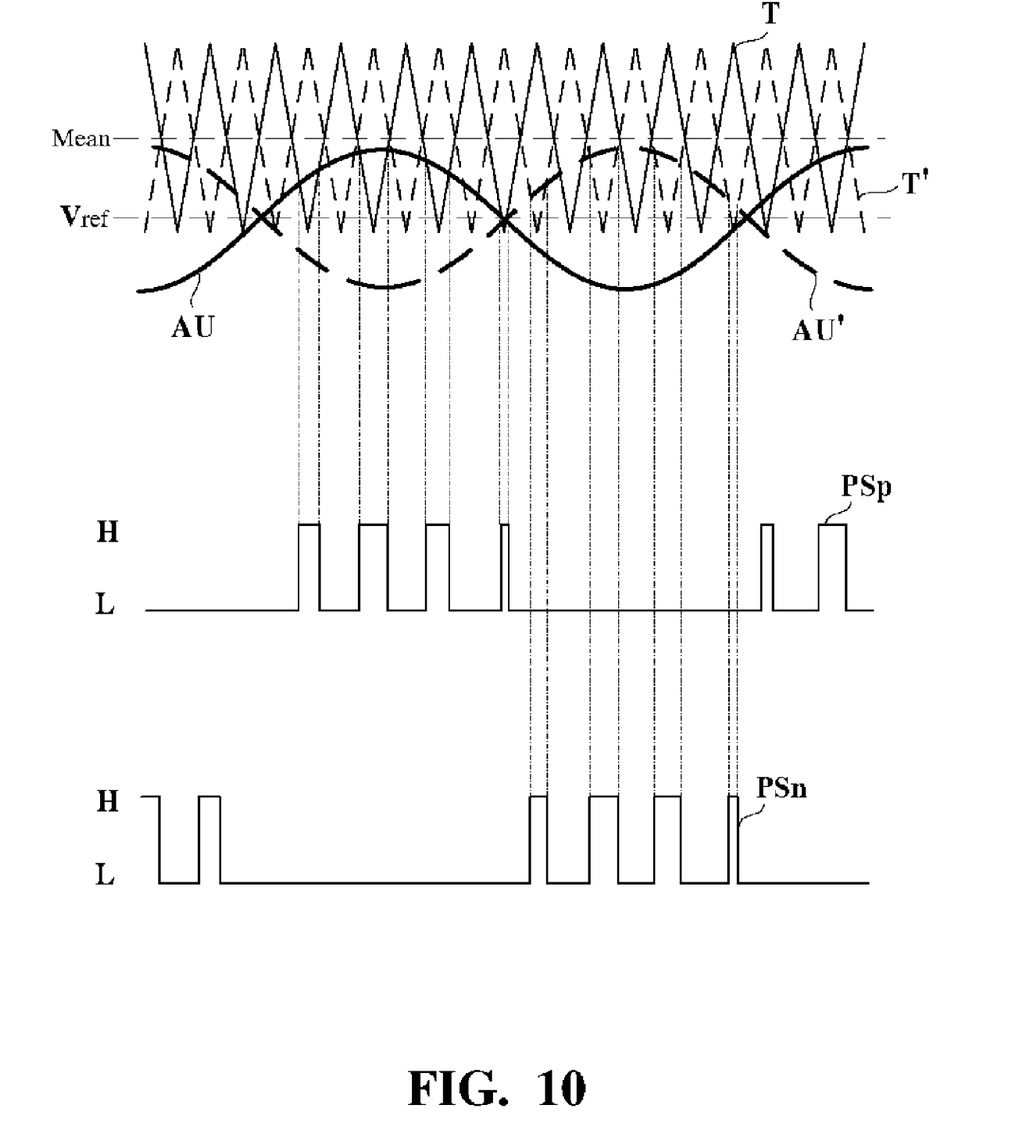
FIG. 10 is a waveform timing chart showing an operation of a tri-state switching amplifier according to a fifth embodiment of the present invention.

FIG. 10 is a waveform timing chart showing an operation of the tri-state switching amplifier 90 according to the fifth embodiment of the present invention. The oscillating circuit 91 generates an oscillating signal T and an inverted oscillating signal T', which are out of phase with respect to each other. Additionally, a mean level of the oscillating signal T is in coincidence with a mean level of the inverted oscillating signal T'.

A reference level $V_{ref}$ of an input signal AU is set between the peak and the valley of the oscillating signal T. In one embodiment, the difference between the reference level $V_{ref}$ and the valley of the oscillating signal T is substantially equal to 5% of the difference between the peak and the valley of the oscillating signal T. In another embodiment, the difference between the peak of the oscillating signal T and the reference level $V_{ref}$ is substantially equal to 5% of the difference between the peak and the valley of the oscillating signal T. Through using the reference level as a symmetric axis, the inverting circuit 92 transforms the input signal AU into an inverted input signal AU'.

Based on the comparison of the oscillating signal T and the input signal AU, the first PWM comparator 22 generates a first PWM signal $PS_p$ with binary states H and L. Based on the comparison of the inverted oscillating signal T' and the inverted input signal AU', the second PWM comparator 23 generates a second PWM signal $PS_n$ with binary states H and L.

Figure 11:
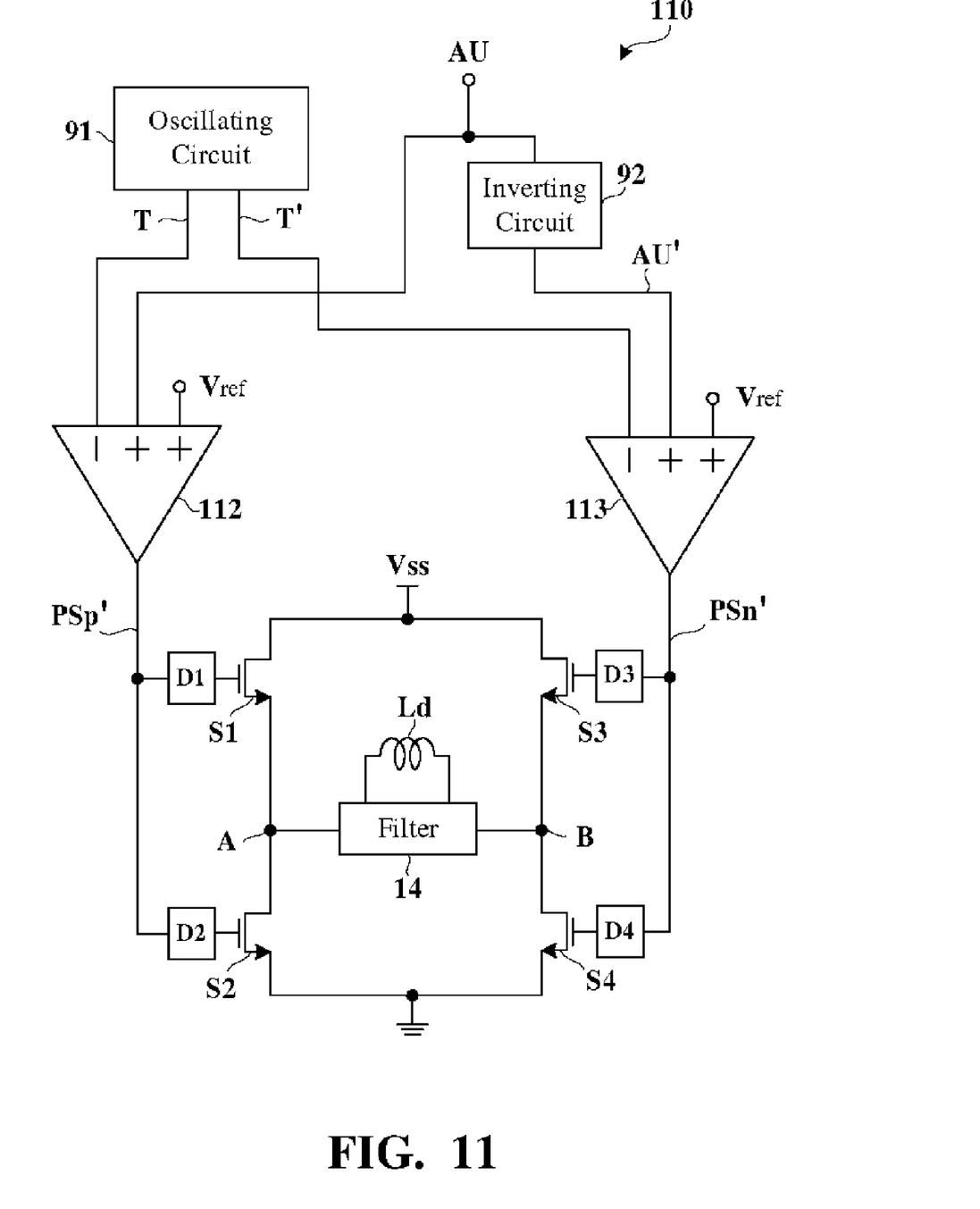
FIG. 11 is a circuit block diagram showing a tri-state switching amplifier according to a sixth embodiment of the present invention.

FIG. 11 is a circuit block diagram showing a tri-state switching amplifier 110 according to a sixth embodiment of the present invention. In FIG. 11, for simplicity, like reference numerals have been used to identify like components illustrated in FIG. 9 and previously described, with additional detail being shown in the timing and control portion of the circuit relevant to the sixth embodiment. The sixth embodiment is different from the fifth embodiment in that the tri-state switching amplifier 110 according to the sixth embodiment replaces the first PWM comparator 22 and the first width limiting circuit 24 of FIG. 9 with a first tri-input PWM comparator 112 and replaces the second PWM comparator 23 and the second width limiting circuit 25 of FIG. 9 with a second tri-input PWM comparator 113. More specifically, the first tri-input PWM comparator 112 has an inverting input terminal for receiving the oscillating signal T, and two non-inverting input terminals for respectively receiving the input signal AU and the reference level $V_{ref}$. Once the oscillating signal T becomes smaller than either of the input signal AU and the reference level $V_{ref}$, the first tri-input PWM comparator 112 generates the pulse. On the other hand, the second tri-input PWM comparator 113 has an inverting input terminal for receiving the inverted oscillating signal T', and two non-inverting input terminals for respectively receiving the inverted input signal AU' and the reference level $V_{ref}$. Once the inverted oscillating signal T' becomes smaller than either of the inverted input signal AU' and the reference level $V_{ref}$, the second tri-input PWM comparator 113 generates the pulse.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A switching amplifier comprising:
   an oscillating circuit for generating an oscillating signal having a valley, a mean level, and a peak;
   a level shifting circuit for adjusting a voltage level of an original input signal to generate a first input signal and a second input signal such that the first input signal is identical to the original input signal except for referring to a first reference level, and the second input signal is identical to the original input signal except for referring to a second reference level, wherein the first reference level is between the mean level and the valley of the oscillating signal and the second reference level is between the peak and the mean level of the oscillating signal;
   a first control circuit for generating a first width-limited pulse-width-modulation (PWM) signal in response to the first input signal and the oscillating signal, the first width-limited PWM signal having a pulse each cycle with a width larger than or equal to a predetermined first width;
   a second control circuit for generating a second width-limited PWM signal in response to the second input signal and the oscillating signal, the second width-limited PWM signal having a pulse each cycle with a width larger than or equal to a predetermined second width;
   a first half-bridge switching circuit controlled by the first width-limited PWM signal for determining a potential at a first output terminal; and
   a second half-bridge switching circuit controlled by the second width-limited PWM signal for determining a potential at a second output terminal.

2. The switching amplifier according to claim 1, wherein:
   the first control circuit comprises:
      a first PWM comparator for generating a first PWM signal based on a comparison of the first input signal and the oscillating signal, and
      a first width limiting circuit for transforming the first PWM signal into the first width-limited PWM signal, and
   the second control circuit comprises:
      a second PWM comparator for generating a second PWM signal based on a comparison of the second input signal and the oscillating signal, and
      a second width limiting circuit for transforming the second PWM signal into the second width-limited PWM signal.

3. The switching amplifier according to claim 2, wherein:
   the first width limiting circuit comprises:
      a circuit for generating a first width signal in response to the first reference level and the oscillating signal, the first width signal having a pulse each cycle with the predetermined first width, and
      a circuit for generating the first width-limited PWM signal in response to the first PWM signal and the first width signal, and
   the second width limiting circuit comprises:
      a circuit for generating a second width signal in response to the second reference level and the oscillating signal, the second width signal having a pulse each cycle with the predetermined second width, and
      a circuit for generating the second width-limited PWM signal in response to the second PWM signal and the second width signal.

4. The switching amplifier according to claim 1, wherein:
   a difference between the first reference level and the valley is substantially equal to 5% of a difference between the peak and the valley.

5. The switching amplifier according to claim 1, wherein:
   a difference between the peak and the second reference level is substantially equal to 5% of a difference between the peak and the valley.

6. The switching amplifier according to claim 1, wherein:
   the first control circuit is implemented by a tri-input PWM comparator having two first-type input terminals and one second-type input terminal, the two first-type input terminals respectively receiving the first input signal and the first reference level and the second-type input terminal receiving the oscillating signal, and
   the second control circuit is implemented by another tri-input PWM comparator having one first-type input terminal and two second-type input terminals, the first-type input terminal receiving the oscillating signal and the two second-type input terminals respectively receiving the second input signal and the second reference level.

7. The switching amplifier according to claim 1, further comprising:
   a filter circuit coupled between the first output terminal and the second output terminal.

* * * * *